United States Patent
Duello et al.

(10) Patent No.: US 6,236,284 B1
(45) Date of Patent: May 22, 2001

(54) RF POWER AMPLIFIER SYSTEM HAVING DISTRIBUTED MODULATION ENCODING

(75) Inventors: Wayne D. Duello, Hamilton; Douglas J. Posey, Centerville; Theodore Korte, Hamilton, all of OH (US)

(73) Assignee: Harris Corporation, Melbourne, FL (US)

( * ) Notice: Subject to any disclaimer, the term of this patent is extended or adjusted under 35 U.S.C. 154(b) by 0 days.

(21) Appl. No.: 09/545,305

(22) Filed: Apr. 7, 2000

(51) Int. Cl.$^7$ ............................... H03C 1/00; H03C 1/02; H03F 3/38; H04B 1/02

(52) U.S. Cl. ........................... 332/149; 332/159; 330/10; 455/108

(58) Field of Search ..................................... 332/149, 150, 332/167, 170; 330/10, 124 R, 124 D; 455/108, 109

(56) References Cited

U.S. PATENT DOCUMENTS 4,580,111   4/1986  Swanson ............................... 332/41
5,392,007 * 2/1995  Cripe .................................... 332/149

* cited by examiner

Primary Examiner—David Mis
(74) Attorney, Agent, or Firm—Tarolli, Sundheim, Covell, Tummino & Szabo L.L.P.

(57) ABSTRACT

An RF power amplifier system is presented herein. It includes a plurality of RF power amplifier modules. At least two encoders are provided. Each encoder is associated with and controls the operation of some of the plurality of power amplifier modules. Each encoder is associated with different ones of the plurality of amplifier modules. An exciter receives an amplitude varying input signal and periodically provides a command signal to each of the modulation encoders and instructs that modulation encoder as to how many of its associated power amplifier modules are to be turned on as a function of the value of the input signal. Each modulation encoder responds to a received command signal and selects which of its associated power amplifiers to turn on.

28 Claims, 7 Drawing Sheets

RF POWER AMPLIFIER SYSTEM HAVING DISTRIBUTED MODULATION ENCODING

BACKGROUND OF THE INVENTION

1. Technical Field

This invention relates to the art of AM radio broadcasting and, more particularly, to a system having distributed modulation encoding for controlling the turn on of a plurality of power amplifier modules.

2. Description of the Prior Art

The H. I. Swanson U.S. Pat. No. 4,580,111 discloses an amplitude modulator for AM radio broadcasting wherein the modulator serves to generate amplitude modulated signals by selectively turning on and off a plurality of RF amplifier modules to produce amplitude modulation. The aforesaid Swanson patent has an encoder that supplies turn on commands to selected amplifier modules. In a system having a large number of power amplifiers, the power amplifiers are divided into groups with each group being provided with turn on signals from an associated modulation encoder. If, for example, each group includes 32 amplifier modules then the first modulation encoder will provide turn on module commands 0–31 if the module command is for turning on a number greater than 31. A second modulation encoder would then respond to modulation commands 32–63 and turn on all its associated power amplifier modules and so on. Any additional modulation encoders will operate with its associated group of power amplifier modules within the corresponding range of module commands.

The difficulty with the multiple modulation encoder system is that if a power amplifier module or modulation encoder fails, no reassignment takes place. Thus, if one of the power amplifiers in a first group controlled by the first modulation encoder fails, and if the failed module was supposed to be turned on, there will be an error in the output signal. There is no sharing of powering the output load among the various groups of power amplifiers in such a system. If the modulation encoder associated with the first group of power amplifier modules fails, the first group of power amplifier modules will not be turned on. Only a simple turn on scheme can be implemented, such as incrementing or decrementing the turn on of the modules upward or downward.

SUMMARY OF THE INVENTION

In accordance with the invention, an RF power amplifier system is provided and it includes a plurality of RF power amplifier modules. At least two encoders are provided. Each encoder is associated with and controls the operation of some of the plurality of power amplifier modules. Each encoder is associated with different ones of the plurality of amplifier modules. An exciter receives an amplitude varying input signal and periodically provides a command signal to each of the modulation encoders and instructs that modulation encoder as to how many of its associated power amplifier modules are to be turned on as a function of the value of the input signal. Each modulation encoder responds to a received command signal and selects which of its associated power amplifiers to turn on.

BRIEF DESCRIPTION OF THE DRAWING

The foregoing and other objects and advantages of the present invention will become more readily apparent from the following description as taken in conjunction with the accompanying drawings, wherein.

DESCRIPTION OF PREFERRED EMBODIMENT

One application of the present invention is in conjunction with RF power amplifiers employed in an AM broadcast transmitter. An example of such a transmitter is presented in FIG. 1 and takes the form of a digital amplitude modulator such as that illustrated and described in the aforesaid U.S. Pat. No. 4,580,111 which is assigned to the same assignee as the present invention, the disclosure of which is herein incorporated by reference.

Figure 1:
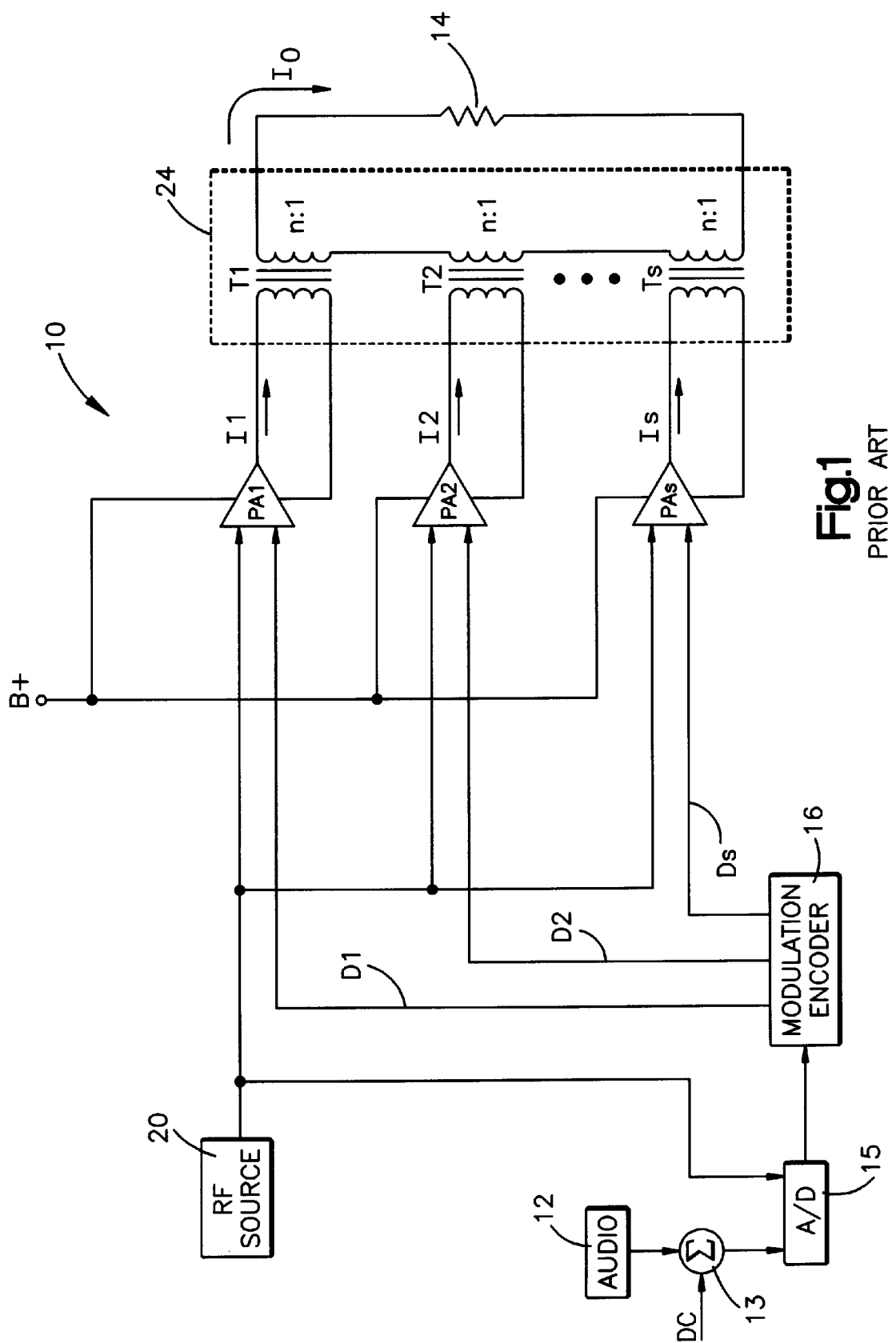
FIG. 1 is a schematic-block diagram illustration of a prior art amplitude modulation power amplifier system.

Referring now to FIG. 1, the amplitude modulator 10 is illustrated as receiving an input signal from input source 12 which may be the source of an audio signal. Modulator 10 generates an RF carrier signal which is amplitude modulated as a function of the amplitude of the input signal from source 12. The amplitude modulated carrier signal is provided to a load 14, which may take the form of an RF transmitting antenna. A modulation encoder 16 provides a plurality of digital control signals D1 through DS. The control signals are binary signals each having a binary 1 or a binary 0 level. The number of signals having binary 1 or binary 0 levels is dependent upon the instantaneous level of the input signal which is digitized by an analog to digital converter 15.

Each of the output control signals D1–DS is supplied to one of a plurality of S RF power amplifier modules $PA_1$–$PA_S$. The control signals serve to turn associated power amplifier modules either on or off. Thus, if the control signal has a binary 0 level, then its associated amplifier module is inactive and no signal is provided at its output. However, if the control signal is of a binary 1 level, then the power amplifier module is active and an amplified carrier signal is provided at its output. Each power amplifier module has an input connected to a single common RF source 20. The carrier signal may be a squarewave. The amplified carrier signals are supplied to a combiner circuit 24 comprised of a plurality of transformers $T_1$, $T_2$, . . . , $T_s$. The secondary windings act as an independent signal source, whereby the signals provided by the various transformers additively combine with one another to produce a combined signal which is supplied to the load 14. This combined signal has the same frequency as the RF signal supplied by the RF source 20, but the amplitude of the combined signal is modulated in accordance with the input signal supplied by the input source 12. A DC voltage, representative of the desired carrier level, is summed with the audio signal 12 at a summer 13. This carrier level provides a carrier signal output even when no modulation takes place.

Figures 2, 3:
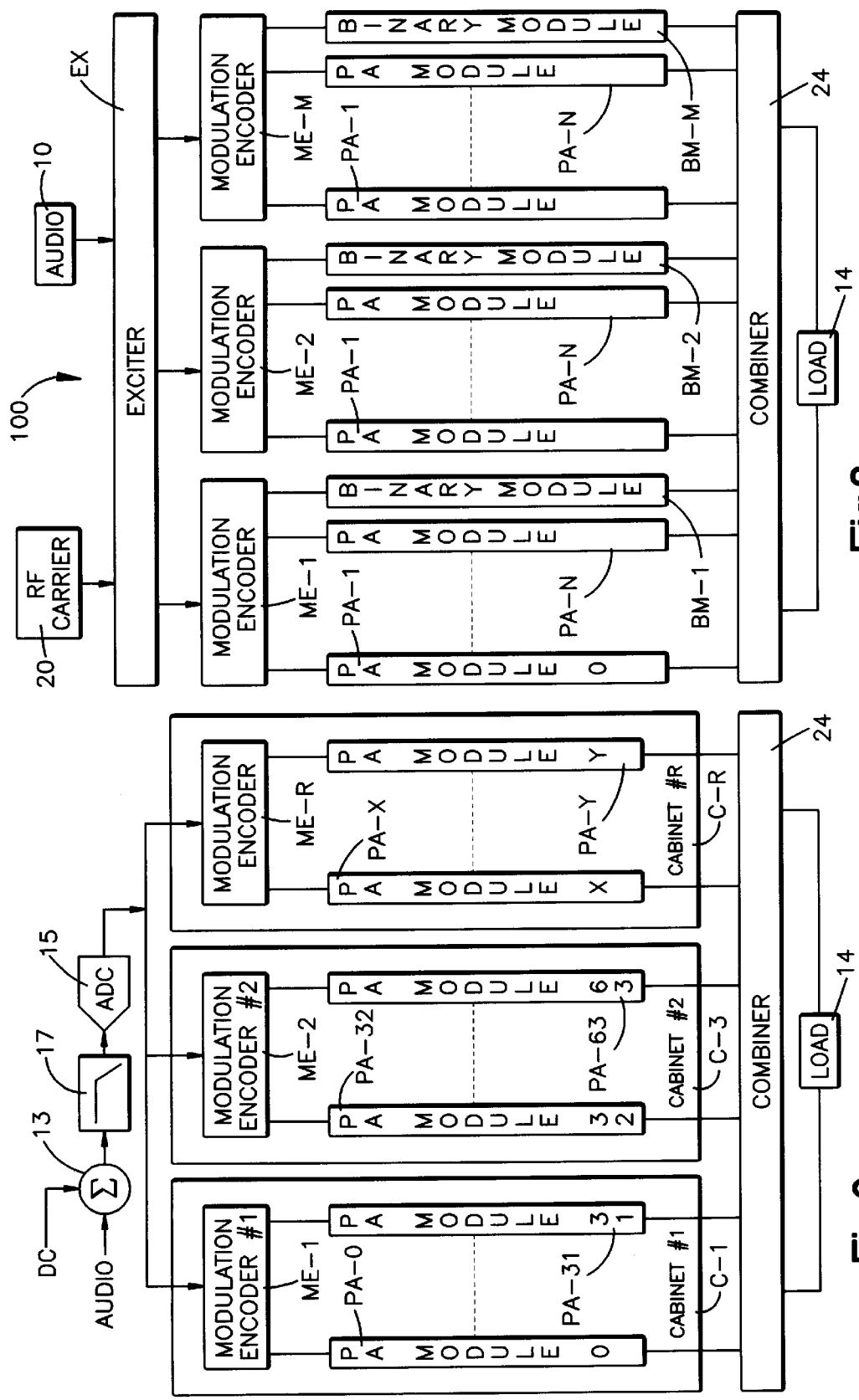
FIG. 2 is a schematic-block diagram illustration of another prior art amplitude modulation power amplifier system.
FIG. 3 is a schematic-block diagram illustration of one embodiment of the present invention.

The prior art shown in FIG. 1 is for a relatively simplified system having a limited number of power amplifier modules. In practice, several groups of power amplifier modules may be employed with each group being controlled by an associated modulation encoder which provides turn on commands to each of the power amplifier modules in the associated group. Such a prior art system is illustrated in FIG. 2 to which attention is now directed. This prior art system employs components similar to those illustrated in FIG. 1 and consequently like components are described in FIG. 2 with like character references. The audio and DC signals are summed by a summer 13 and applied through a filter 17 to an analog-to-digital converter 15 which converts input signals into 12 bit digital signals at a sample rate synchronized to the carrier frequency (not shown). The output of the analog-to-digital converter 15 is supplied to modulation encoders ME-1, ME-2. . ., ME-R. Each of these modulation encoders controls the supply of turn on signals to an associated plurality of power amplifier modules. For example, modulation encoder ME-1 supplies turn on signals to 32 power amplifiers from power amplifier modules PA-0 to PA-31. All of these modules and the modulation encoder may be located in a cabinet C-1. Similarly, modulation encoder ME-2 controls the application of turn on signals to another associated group of 32 power amplifier modules, including modules PA-32 through PA-63. Modulation encoder ME-2 as well as the power amplifier modules PA-32 through PA-63 may all be located in a second cabinet C-2. Similarly, several other modulation encoders and associated power amplifier modules may be employed in the system through modulation encoder ME-R and its associated group of power amplifier modules PA-X through PA-Y all of which may be located in the cabinet C-R. In the example presented in FIG. 2, each of the modulation encoders has unique firmware that responds to module commands in its particular range. Thus, modulation encoder ME-1 responds to module commands 0–31 and turns on all its associated power amplifier modules PA-0 through PA-31 if the module command calls for more than 31 power amplifiers to be turned on. Similarly, modulation encoder ME-2 responds to module commands 32–63 and turns on all of its power amplifier modules PA-32 through PA-63 if the module command requires that 63 or more power amplifier modules be turned on. The remaining modulation encoders operate in the same manner but within their corresponding range. The outputs of the power amplifier modules that are turned on are combined in a combiner 24 and applied to a load 14.

The system, as illustrated in FIG. 2, has several limitations. If a power amplifier module fails, there is no provision for reassigning a different power amplifier module to take its place. Consequently, the step voltage requested by the module command will not take place and an erroneous output is supplied to the load 14. Also, if a modulation encoder fails, no reassignment can take place. For example, assume the carrier level represented by the DC voltage supplied to the summation device 13 calls for a module command of 30. If modulation encoder ME-1 has failed there will be no carrier signal transmitted in the absence of modulation by the audio signal. Thus, only a simple module turn on scheme can be implemented with such a system, such as incrementing or decrementing the turning on and turning off of modules. Reference is now made to FIG. 3 which presents a generalized block diagram illustrating one embodiment of the invention, a more detailed block diagram is presented in FIGS. 4.

In this description of the embodiment shown in FIG. 3, components which are similar to those described with respect to FIGS. 1 and 2 will be described with the same character references. Thus, the power amplifier system 100 according to this embodiment employs an exciter EX that receives an RF carrier signal from an RF source 20 together with an amplitude varying input signal, such as an audio signal, from a source 10. This system will amplitude modulate the carrier by turning on a plurality of power amplifier modules as a function of the value of the audio input signal 10. The output voltages from the power amplifier modules are combined in a combiner 24 and applied to the load 14.

Each of the power amplifiers PA-1 through PA-N associated with each module encoder ME-1 through ME-M when turned on provides a unit or big step voltage signal. Also, each module has a status output (not shown in FIG. 3, see FIG. 4B) that provides a fault indication to the associated module encoder if the power amplifier module has failed. It is to be noted from FIG. 3 that the modulation encoders ME-1 through ME-M supply turn on signals to associated binary modules BM-1 through BM-M (these binary modules will be described in greater detail hereinafter). These binary modules also have a status output for providing a fault indication.

The exciter EX receives the audio signal from the audio source 10 and for each carrier cycle it provides a module command to each of the modulation encoders ME-1 through ME-M. That module command includes a module command word and a binary command word. The module command word tells the modulation encoder how many of its associated amplifier modules PA-1 through PA-N are to be turned on. The binary command tells the modulation encoder which portions of a binary power amplifier module are to be turned on (this will be explained in greater detail later).

The exciter EX distributes these module commands in priority to the modulation encoders. The modulation encoders distribute the module commands in priority to the power amplifier modules.

Figure 4A:
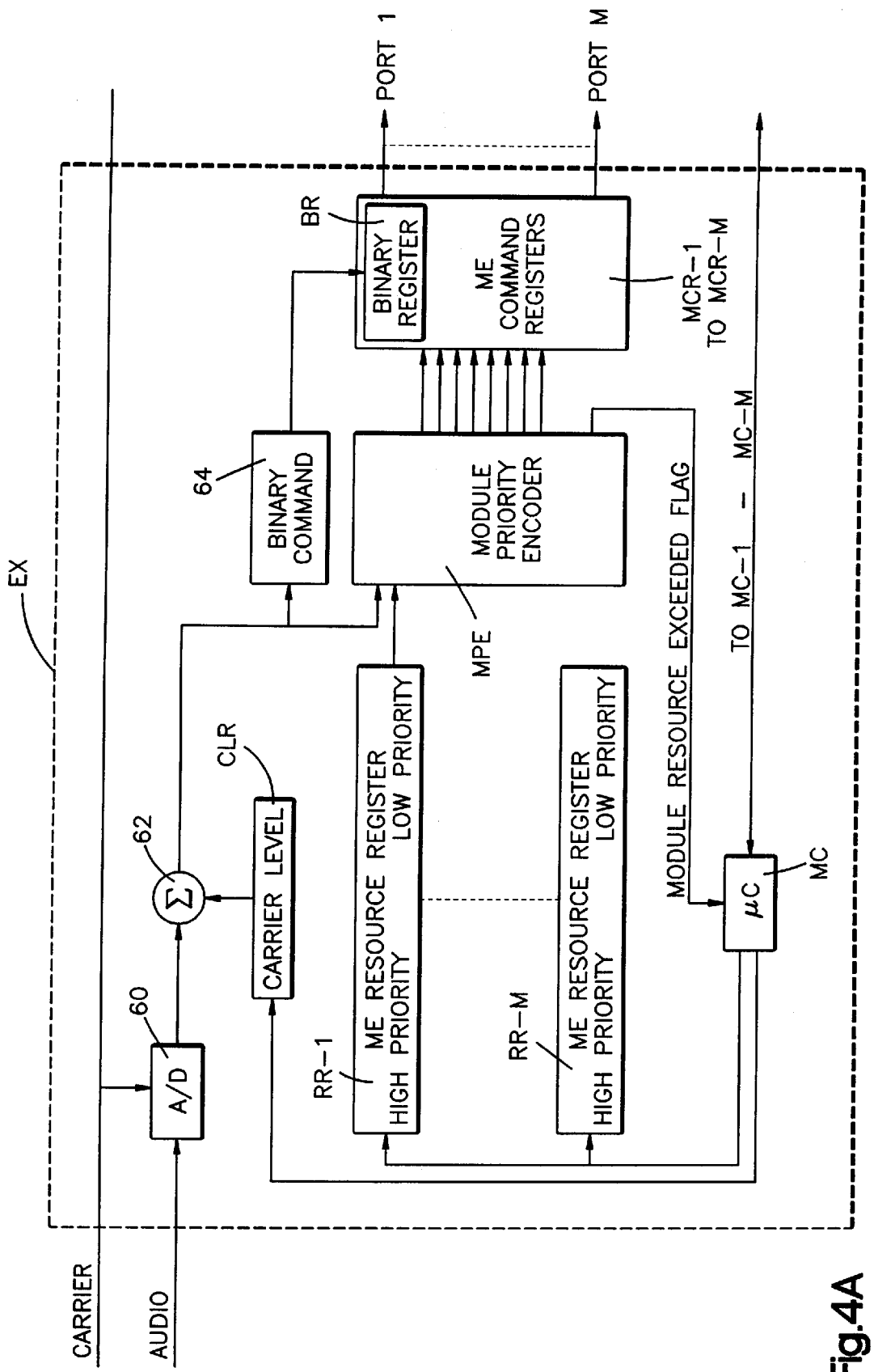
FIGS. 4A and 4B are a more detailed schematic-block diagram illustration of the embodiment of the invention.
Figure 4B:
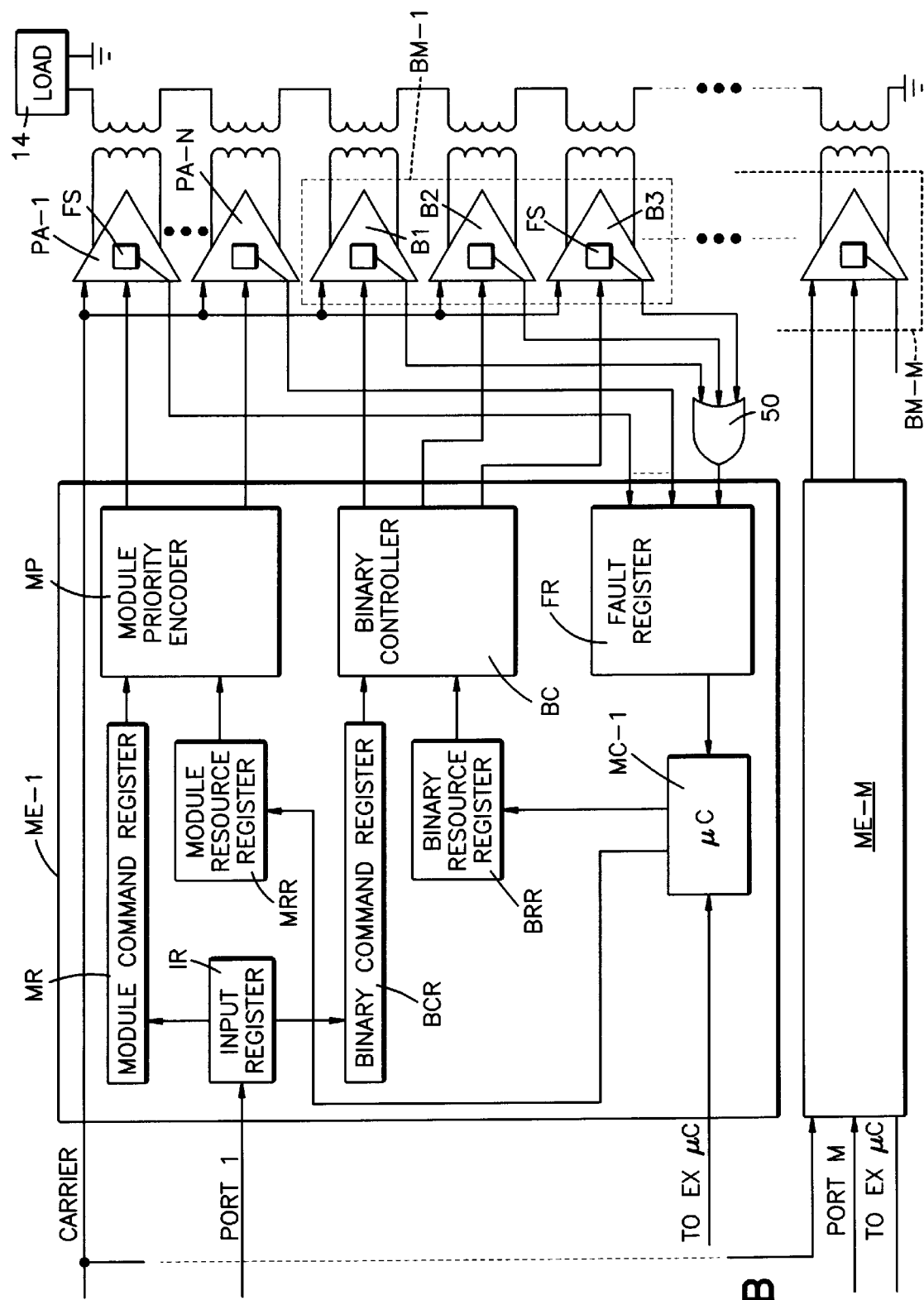
Figure 5:
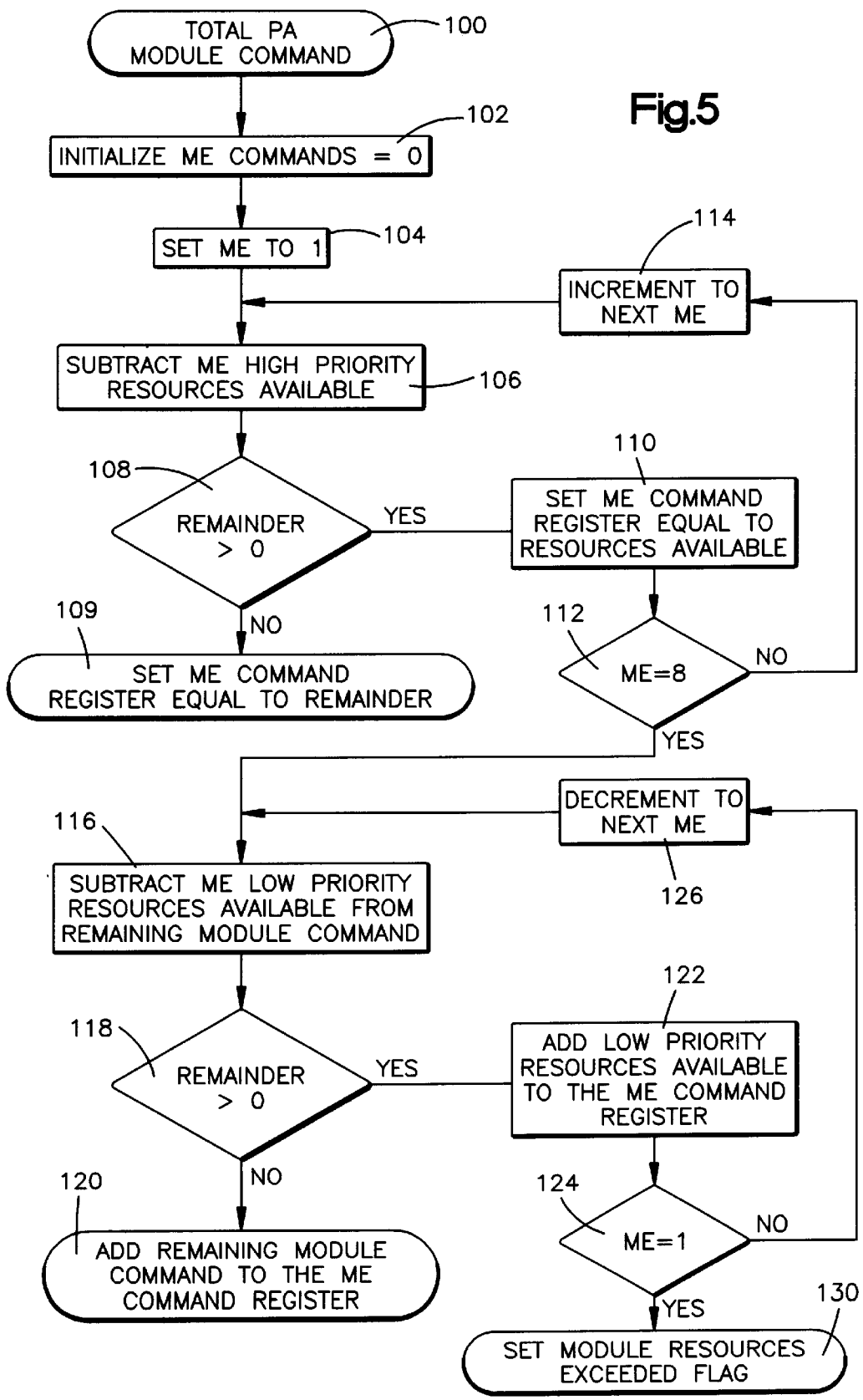
FIG. 5 is a flow chart useful in describing the invention.
Figure 6:
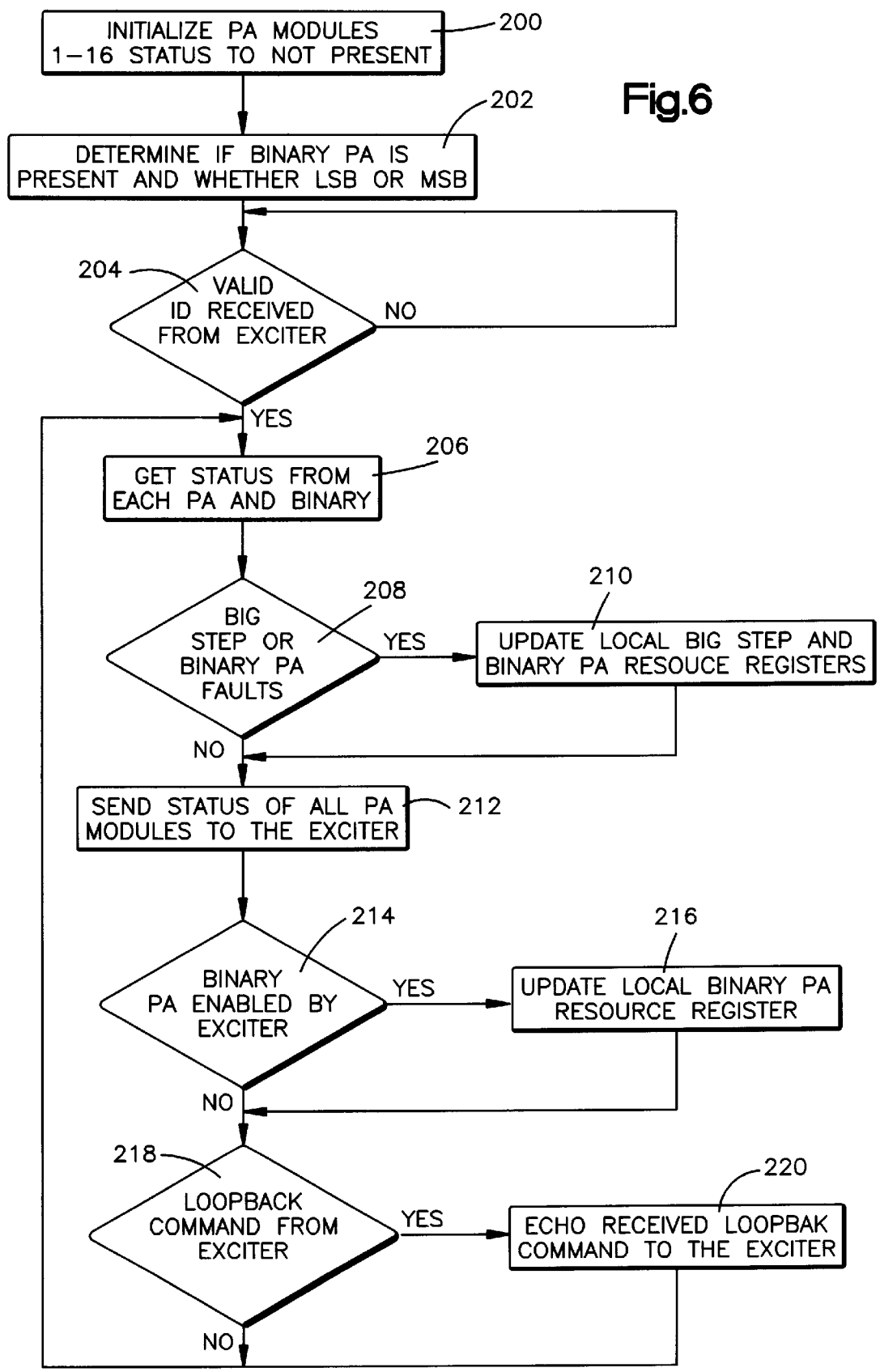
FIG. 6 is a flow chart useful in describing the invention.
Figure 7:
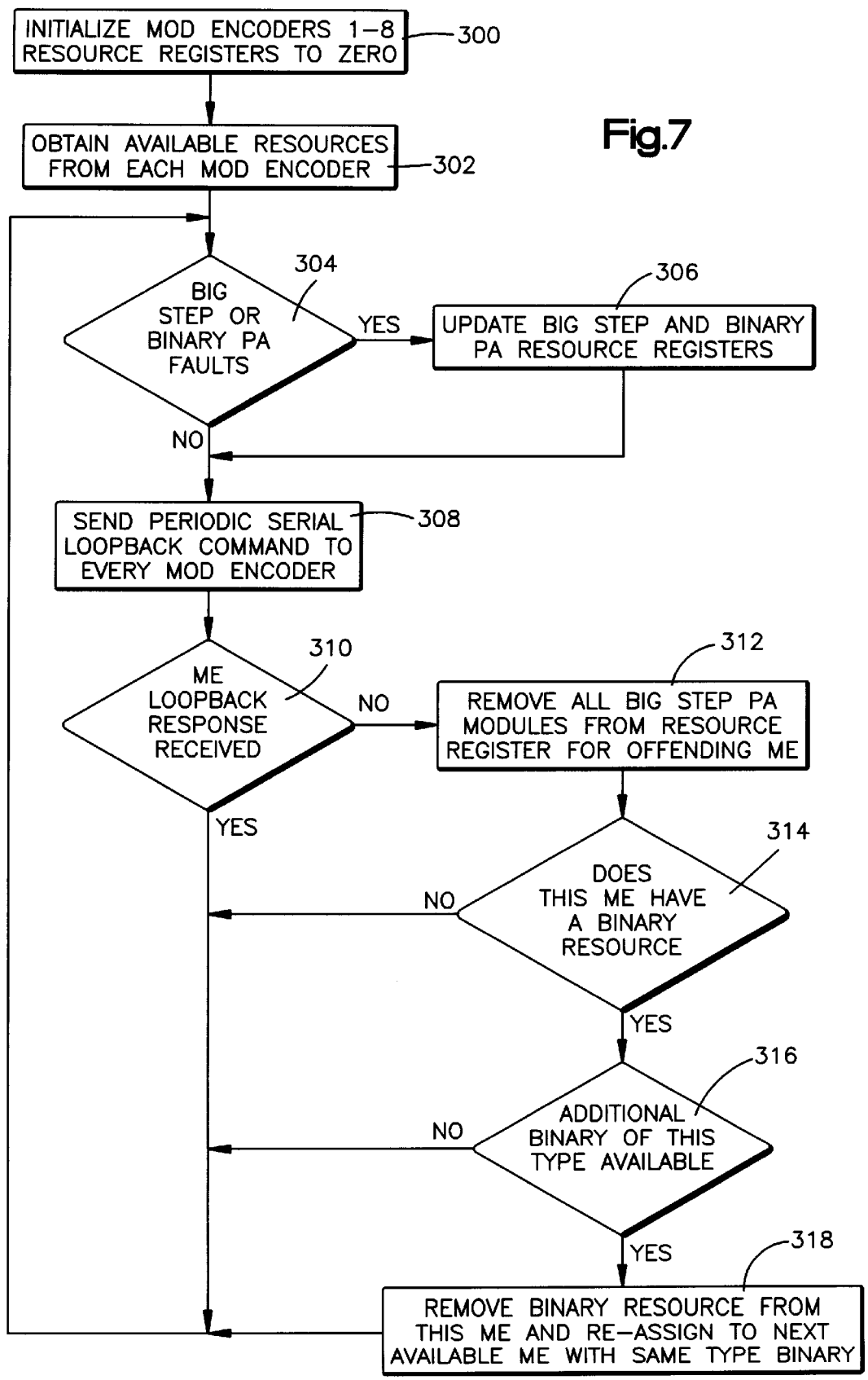
FIG. 7 is a flow chart useful in describing the invention.

Having presented a general explanation relative to the embodiment as shown in FIG. 3, reference is now made to the more detailed block diagrams in FIGS. 4A and 4B as well as the flow charts of FIGS. 5–7.

Reference is now made to the block diagram of FIGS. 4A and 4B taken together. As previously pointed out, the exciter EX communicates with each of the modulation encoders ME-1 through ME-M which then provide turn on signals to various associated power amplifier modules. As shown in FIG. 4B the modulation encoder ME-1 applies a carrier signal to each of its associated power amplifier modules PA-1 through PA-N. Additionally, it applies a turn on command to the power amplifier modules that are to be turned on. Each of these power amplifier modules is provided with a fault sensor FS which provides a fault indication if the module has failed. It is to be noted that the binary module BM-1 is illustrated in FIG. 4B as including three binary amplifiers B-1, B-2 and B-3. These are at different weights which will be described hereinafter. These three binary amplifiers B-1, B-2 and B-3 each include a fault sensor FS. The fault outputs of the binary module BM-1 are applied to an OR gate 50 which supplies a fault indication to a fault register FR if any one of the three binary amplifiers B-1, B-2 and B-3 have provided a fault indication. Also, the power amplifier modules PA-1 through PA-N also provide fault indications to the fault register FR if any of these modules have faulted. Consequently, the fault register FR is provided with information as to whether any of the power amplifier modules including the binary module BM-1 have failed. A microcontroller MC-1 in the modulation encoder ME-1 periodically obtains this information from the fault register and supplies the information to a microcontroller MC at the exciter EN. The microcontroller MC-1 at module encoder ME-1 also uses this information from the fault register FR to update a module resource register and a binary register encoder and this will be described in greater detail hereinbelow.

A microcontroller MC at the exciter EX (FIG. 4A) is in communication with the microcontrollers MC-1 through MC-M in the respective modulation encoders ME-1 through ME-M and periodically obtains information. This information includes the number of amplifier modules associated with each modulation encoder that have provided a fault indication. It is to be noted at this point that each group of power amplifiers PA-1 through PA-N associated with each of the modulation encoders are divided into two priority levels, referred to hereinafter as high priority and low priority. In addition, each of the low priority amplifier modules are of different priority levels. For example, if there are sixteen power amplifier modules forming a group associated with modulation encoder ME-1, then one portion will be considered as the high priority level modules and the rest will be considered as low priority modules. In the embodiment being described, the portions may be equal such as eight modules in each portion, although the numbers could be different from that. In this example there are eight low priority modules and eight high priority modules. The high priority modules have priority levels 1–8 and the low priority modules have priority levels of 9–16. The priority levels refer to the order in which the power amplifier modules are to be turned on. If the command requires that five power amplifier modules be turned on, the five modules having the five highest priority levels i.e., priority levels 1–5 will be turned on and so forth.

The microcontroller MC at the exciter communicates with the microcontrollers in all of the modulation encoders to obtain information as to how many of the amplifier modules in the associated group have provided a fault indication. This information is then used by the microcontroller MC at the exciter EX to provide amplifier module resource availability data for each modulation encoder regarding how many of the power amplifier modules are available for use (that is how many are available after subtracting the number that have provided fault indications). The microcomputer MC at the exciter EX obtains information from each of the microcontrollers at the modulation encoders ME-1 through ME-M as to the number of associated high priority amplifier modules and the number of its associated low priority amplifier modules that are available. This information is then loaded into an associated resource registers RR-1 through RR-M in the exciter EX. Other than the analog-to-digital converter and the microcontroller MC, all of the components shown in FIG. 4A may be implemented by a field programmable gate array FPGA.

The exciter EX includes a module priority encoder MPE that operates during each carrier cycle to receive the information from the resource registers RR-1 through RR-M and provide a command for each modulation encoder as to how many amplifier modules in the group of power amplifiers associated with that particular modulation encoder are to be turned on. This is based on the resource availability data obtained from the registers RR-1 through RR-M and the value of the input signal. The module priority encoder MPE is implemented in a field programmable gate array (FPGA).

The audio signal is supplied to an analog-to-digital converter 60 which is operated at a rate synchronized to that of the carrier frequency. The digitized audio is then summed at a summer 62 with a carrier level obtained from a carrier level register CLR. The carrier level which represents the level at which the carrier signal should be provided in the absence of modulation. The carrier level calls for a particular number of the power amplifiers to be turned on. This carrier level may be obtained from various sources such as the exciter microcontroller MC. The output from the summing device 62 serves as the input signal to the modulation priority encoder MPE as well as to a binary command circuit 64, to be described hereinafter.

Reference is now made to the flow chart of FIG. 5 which illustrates the manner in which the module priority encoder MPE is programmed. Initially, at step 100, the module priority encoder obtains information from the input signal representing the total power amplifier module command. The value of the input signal determines the total number of power amplifier modules that must be turned on.

The procedure advances to step 102 at which all module encoder commands are initialized as being zero. The procedure then advances to step 104.

In step 104, the procedure sets the modulation encoder being processed as modulation encoder ME-1. The procedure advances to step 106.

In step 106, the number of high priority resources that are available in the modulation encoder ME-1 are obtained from the high priority portion of resource register RR-1 (FIG. 4A) and subtracted from the module command or the remaining module command. The procedure then advances to step 108.

In step 108, a determination is made as to whether the remainder (that is, the total command less the number of high priority resources available in modulation encoder ME-1) is greater than zero. If it is not, the procedure advances to step 109 and the ME command register MCR-1 (FIG. 4A) associated with this encoder is set to equal the remainder. The ME command registers MCR-1 through MCR-M are respectively associated with ports 1-M and, hence, with modulation encoders ME-1 through ME-M. These ME command registers are located in the exciter along with a binary register BR that receives a binary command from a binary command circuit 64.

If in step 108 the remainder is greater than zero, the procedure advances to step 110 and the ME command register MCR-1 is set equal to the resources available. In this case, if the high priority resources in register RR-1 indicates that there are eight high priority power amplifier modules that are available for the group of power amplifiers associated with modulation encoder ME-1 then that is the number that is set into the command register MCR-1. The procedure now advances to step 112.

In step 112, a determination is made as to whether the module priority being made is for encoder ME-8, If not, the procedure advances to step 114 to increment to the next modulation encoder ME-2 and the procedure repeats steps 106–112, if necessary.

If in step 112 a determination is made that ME equals 8, then all of the available high priority resources in registers RR- through RR-N have been allocated to the ME command registers MCR-1 through MCR-N. It is to be noted that in this example N equals 8. This means that the total power amplifier module command is for a number of power amplifier modules that exceeds the number of available high priority power amplifier modules. Consequently, the procedure must now look to the low priority registers to find additional available resources to satisfy the total power amplifier module command. This is achieved by continuing with the procedure at step 116.

In step 116, the low priority resources available for the modulation encoder ME-M is obtained from resource register PR-M. This number of resources is subtracted from the remaining module command. The procedure then advances to step 118.

In step 118, a determination is made as to whether the remainder is greater than zero. If not, the procedure advances to step 120.

In step 120, the remaining module command is added to the ME command register MCR-M.

If the determination in step 118 is yes, then the procedure advances to step 122.

In step 122, the number of low priority resources available is added to the ME command register MCR-M. The procedure advances to step 124.

In step 124, a determination is made as to whether the modulation encoder being examined is ME-1. If not, the procedure advances to step 126 wherein the modulation encoder being examined is decremented by one and steps 116–126 are repeated until a determination is made that the modulation encoder being examined is ME-1. If so, the total PA module command is greater than the resources available and the procedure advances to step 130 at which this condition is reported to the microcontroller MC in the exciter (see FIG. 4A).

All the commands for modulation encoders ME-1 through ME-N are loaded into the ME command registers MCR-1 to MCR-N and the binary command from binary command circuit 64 is loaded into the binary register BR. The ports 1 through M are connected by way of serial buses to the modulation encoders ME-1 to ME-M. As shown in FIG. 4B the data from the ME command register MCR-1 together with binary data from the binary register BR are supplied in serial fashion at port 1 to a serial bus to the input port 1 on encoder ME-1. The total command may include, for example, a five bit power amplifier module command and a six bit binary module command. The data is applied to an input register IR. The five bit power amplifier module command is loaded into the module command register MR and the binary command is entered into the binary command register BCR. The five bit word placed into the module command register MR represents a command as to how many power amplifier modules PA-1 through PA-N associated with this modulation encoder ME-1 are to be turned on. This does not provide instructions as to which ones to turn on but only how many to turn on. The decision as to which ones to turn on is left to the module priority encoder MP at the modulation encoder ME-1. This decision is based on how many module resources are available and this is obtained from information in the module resource register MRR. The module resource register is periodically updated by the microcontroller MC-1 in the modulation encoder ME-1 and the operation of the microcontroller will be described hereinbelow with reference to the flow chart of FIG. 6.

At this point, attention is directed to the binary controller BC and the binary module BM-1. Sometimes the total command requires that several big or unit step power amplifiers be turned on together with a fractional step, where a fractional step represents a voltage which is a fraction of a big or unit step. This embodiment of the invention contemplates that there are up to six fractional steps available. These fractional steps are sometimes referred to herein as binary steps. These are ½, ¼, ⅛, ¹⁄₁₆, ¹⁄₃₂, and ¹⁄₆₄. There are six bits in the binary command that represent these six fractional or binary steps. The most significant bit commands that the fraction be ½ and the least significant bit commands a fraction of ¹⁄₆₄. The interim bits are similarly weighted. Each binary module includes up to three steps, either the lower half that is ¹⁄₁₆, ¹⁄₃₂ and ¹⁄₆₄ or the upper half meaning ½, ¼ and ⅛. Consequently the three most significant bits (MSB) represent the larger fractions and the three least significant bits (LSB) represent the smaller fractions. Each of the binary modules BM-1 in the encoders are designated as either a most significant bit module (MSB) or a least significant module (LSB).

Reference is now made to FIG. 6 which represents a flow chart illustrating the manner in which the microcontroller MC-1 in the modulation encoder ME-1 is programmed. The procedure commences with step 200 wherein the status of the power amplifier modules PA1-N (where N equals 16 in this example) is initialized as none being present. The procedure advances to step 202. In step 202, a determination is made as to whether this modulation encoder has an associated binary module, such as binary module BM-1, and if so whether the binary module is a least significant bit (LSB) module or a most significant bit (MSB) module. The procedure then advances to step 204 during which a determination is made as to whether the I.D. received from the exciter is valid. If the determination is no, then the step is repeated. If the determination is yes, the procedure advances to step 206.

In step 206, the microcontroller in the modulation encoder obtains status information from each of its associated power amplifier modules and the binary module. The procedure then advances to step 208.

In step 208, a determination is made as to whether there are any big or unit step (power amplifier module) faults or any binary power amplifier faults. This information is supplied by the fault sensors FS to the fault register FR which is interrogated periodically by the microcontroller.

If the determination in step 208 is yes, then the procedure advances to step 210. In step 210, the microcontroller MC-1 updates the local big step or unit step module resource register MRR to the number of available resources i.e., the number of available power amplifier modules PA-1 through PA-N. Also, the microcontroller MC-1 updates the binary resource register BRR so that this register knows whether the associated binary module is a least significant bit module or a most significant bit module and whether the module is available. The procedure then advances to step 212.

In step 212, the microcontroller MC-1 sends the status of all the power amplifier modules to the microcontroller MC in the exciter EX which then updates the modulation encoder resource registers RR-1 through RR-M as was discussed hereinbefore. The procedure then advances to step 214.

In step 214, a determination is made as to whether the binary power amplifier module has been enabled by the exciter. If so, the procedure advances to step 216 during which the local binary power amplifier resource register BRR is updated and the procedure advances to step 218. In step 218, a determination is made as to whether a loopback command has been received from the exciter EX. If the determination is yes, the procedure advances to step 220 during which the microcontroller MC-1 at the modulation encoder ME-1 answers back to the microcontroller MC at the exciter. The answer back entails sending back to the exciter the same command that was received i.e., an echo. If the answer in determination step 218 is negative or the echo has been transmitted, the procedure loops back to step 206.

The module priority encoder MP receives the module command from the module command register MR commanding how many of the associated power amplifier modules PA-1 through PA-N are to be turned on. This is a five bit command which may be used to provide turn on signals for all 16 power amplifiers, if necessary. In this embodiment up to 8 power amplifiers will be turned on and up to 8 turn on commands will be supplied by the module priority encoder to a maximum of 8 power amplifiers PA-1 through PA-N. However, if the module resource register indicates that some of these power amplifier modules have failed, then the number of failures is subtracted from 8 to provide the number of available resources. If less than 8 are to be turned on then the ones that are to be turned on will follow the priority levels 1, 2, 3, etc. If the highest priority power amplifier (that is priority level 1) has failed, then the microcontroller MC-1 indicates to the module resource register that the highest priority power amplifier module to be turned on will now be the next highest i.e., power amplifier PA-2 and so forth.

The binary controller BC receives the 6 bit binary command. If the most significant bit is a binary "1" signal means that the binary amplifier module that provides a ½ a big step or unit step voltage is to be turned on. If the least significant bit is high (binary 1) then the least significant binary power amplifier module that provides ¹⁄₆₄ of a big step or unit step of voltage is to be turned on. The binary controller BC receives information from the binary resource register BRR as to whether the associated binary module BM-1 is a most significant bit module (MSB) or a least significant bit module (LSB). With this knowledge, the binary controller BC then applies control turn on signals to the selected binary module amplifiers B-1, B-2 or B-3 of the proper type binary module in accordance with the information obtained from the register BRR and the command register BCR.

The foregoing takes place in parallel at each of the modulation encoders ME-1 through ME-8 and the turn on commands for the selected power amplifier modules and binary modules for each group is effective for one carrier cycle.

The microcontroller MC at the exciter periodically interrogates each of the modulation encoders ME-1 through ME-N to determine the available resources for each encoder and then updates the resource registers RR-1 through RR-N (FIG. 4A). If one of the modulation encoders fails to respond to the interrogation, then the microcontroller MC initiates a procedure to reassign the resources. This procedure is set forth in the flow chart of FIG. 7 to which attention is now directed.

FIG. 7 presents a flow chart illustrating the manner in which the microcontroller MC in the exciter EX is programmed to accomplish these features. The procedure starts at step 300 wherein the ME resource registers RR-1 through RR-N are initialized at zero. The procedure advances to step 302. At step 302, the microcontroller obtains information from each of the modulation encoders ME-1 through ME-M as to the number of available resources at each location. The procedure then advances to step 304. At step 304, a determination is made as to whether there are any big or unit step faults among the power amplifier modules or whether there are any faults of the binary power amplifier modules. If the determination is yes, the procedure advances to step 306 at which the microcontroller updates the registers RR-1 through RR-N as well as the binary command circuit 64.

The procedure then advances to step 308 during which the microcontroller MC at the exciter EX sends a periodic serial loopback command or interrogation to all of the modulation encoders ME-1 through ME-N. The procedure advances to step 310.

In step 310, a determination is made as to whether a loopback response was received from each interrogated modulation encoder (see steps 218 and 220 in FIG. 6). If the determination is yes, the procedure loops back to step 304. If the determination is negative, the procedure advances to step 312.

In step 312, the microcontroller removes all of the unit step power amplifier modules from the resource register for the offending modulation encoder. Thus, for example, if the offending modulation encoder is encoder ME-2 then the corresponding resource register RR-2 in the exciter will have no available resources in either its high priority portion or its low priority portion. This has indicated that modulation encoder ME-2 and its associated power amplifier modules have been removed from the system.

The procedure then advances to step 314 during which a determination is made as to whether the offending modulation encoder has a binary resource. That is, does this modulation encoder have a binary module, such as binary module BM-1 in FIG. 4B. If the answer is no, the procedure just loops back to step 304. If the answer is yes, then the procedure advances to step 316. In step 316, a determination is made as to whether an additional binary module of the type associated with the offending modulation encoder is available. That is, if the binary module associated with the offending modulation encoder was the least significant bit LSB binary module, then a determination is made as to whether an additional such binary module is available for use. If not, the procedure loops back to step 304. However, if the answer is yes, then the procedure advances to step 318.

In step 318, the binary resources for the offending modulation encoder are removed and reassigned to the next available modulation encoder having the same type of binary module.

Although the invention has been described in conjunction with a preferred embodiment, it is to be appreciated that various modifications may be made without departing from the spirit and scope of the invention as defined by the appended claims.

Having described the invention we claim:

1. An RF power amplifier system comprising:
a plurality of RF power amplifier modules;
at least two encoders each associated with and controlling the operation of some of said plurality of power amplifier modules, and wherein each said encoder is associated with different ones of said plurality of amplifier modules;
an exciter that receives an amplitude varying input signal and periodically provides a command signal to each said modulation encoder instructing that modulation encoder as to how many of its associated power amplifier modules are to be turned on as a function of the value of said input signal;
each said modulation encoder responds to a received said command signal and selects which of its associated power amplifiers to turn on.

2. A system as set forth in claim 1 wherein said exciter has a resource availability memory that stores amplifier availability data as to how many of said plurality of amplifier modules are available to be turned on.

3. A system as set forth in claim 1 wherein said exciter has a resource availability memory that stores amplifier availability data as to how many of said amplifier modules associated with each of said encoders is available to be turned on.

4. A system as set forth in claim 3 wherein said exciter has a module priority encoder that provides a said command signal to each said encoder as a function of the value of said input signal and said stored amplifier availability data for that said encoder.

5. A system as set forth in claim 4 wherein the number of said power amplifier modules associated with each said encoder is the same.

6. A system as set forth in claim 4 wherein the power amplifier modules associated with each said encoder include a first priority group and a second priority group and wherein the power amplifier modules in said first group are to be turned on before any of those in said second group are to be turned on.

7. A system as set forth in claim 6 wherein the number of power amplifiers in each said first priority group is equal to the number of power amplifiers in each said second priority group.

8. A system as set forth in claim 6 wherein all of the amplifier modules in said first priority group modules associated with all of said encoders are to be turned on before any of said amplifier modules in said second priority group associated with any of said encoders is turned on.

9. A system as set forth in claim 8 wherein each of said amplifier modules has a status line output for providing a fault indication when that said module has failed and each said encoder has a fault memory for receiving fault indications from its associated power amplifier modules.

10. A system as set forth in claim 9 wherein said exciter has a resource availability memory that stores amplifier availability data as to how many of said amplifier modules associated with each of said encoders is available to be turned on.

11. A system as set forth in claim 10 including a communication link between each said module encoder and said exciter for providing said amplifier availability data to said exciter for storage in said resource availability memory.

12. A system as set forth in claim 11 wherein said exciter has a module priority encoder that provides a said command signal to each said encoder as a function of the value of said input signal and said stored amplifier availability data for that said encoder.

13. A system as set forth in claim 12 wherein the power amplifier modules associated with each said encoder include a first priority group and a second priority group and wherein all of the power amplifier modules in said first priority group are to be turned on before any of those in said second priority group are to be turned on.

14. An RF power amplifier system for amplitude modulating an RF carrier signal comprising:
a plurality of RF power amplifier modules each, when turned on, providing a unit step signal;
at least two modulation encoders each associated with and controlling the operation of some of said plurality of power amplifier modules, and wherein each said encoder is associated with different ones of said plurality of amplifier modules;
an exciter having a resource available memory that stores amplifier availability data representing how many of said amplifier modules associated with each said encoder is available to be turned on, said exciter receives an amplitude varying input signal and periodically provides a command signal to each said modulation encoder instructing that modulation encoder as to how many of its associated power amplifier modules are to be turned on as a function of the value of said input signal and said stored availability data;
each said modulation encoder responds to a received said command signal and selects which of its associated power amplifiers to turn on.

15. A system as set forth in claim 14 wherein said exciter has a module priority encoder that provides a said command signal to each said encoder as a function of the value of said input signal and said stored amplifier availability data for that said encoder.

16. A system as set forth in claim 15 wherein the number of said power amplifier modules associated with each said encoder is the same.

17. A system as set forth in claim 15 wherein the power amplifier modules associated with each said encoder include a first priority group and a second priority group and wherein the power amplifier modules in said first group are to be turned on before any of those in said second group are to be turned on.

18. A system as set forth in claim 17 wherein the number of power amplifiers in each said first priority group is equal to the number of power amplifiers in each said second priority group.

19. A system as set forth in claim 17 wherein all of the amplifier modules in said first priority group modules associated with all of said encoders are to be turned on before any of said amplifier modules in said second priority group associated with any of said encoders is turned on.

20. A system as set forth in claim 17 wherein each of said amplifier modules has a status line output for providing a fault indication when that said module has failed and each said encoder has a fault memory for receiving fault indications from its associated power amplifier modules.

21. A system as set forth in claim 20 wherein said exciter has a resource availability memory that stores amplifier availability data as to how many of said amplifier modules associated with each of said encoders is available to be turned on.

22. A system as set forth in claim 21 including a communication link between each said module encoder and said exciter for providing said amplifier availability data to said exciter for storage in said resource availability memory.

23. An RF power amplifier system having distributed modulation encoding for amplitude modulating a carrier signal by an amplitude varying input signal by turning on a plurality of power amplifier modules as a function of the value of said input signal, comprising:
M groups of N power amplifier modules, each said module, when on, providing a unit step signal and each said module having a status output for providing a fault indication if the module has failed;
M modulation encoders each associated with a particular one of said M groups with each said modulation encoder receiving any said fault indications from said associated group and receiving a modulation encoder command that commands that a specific number of said amplifier modules in the associated group are to be turned on and in response thereto selects which said specific number of its associated power amplifiers to turn on; and,
an exciter that communicates with each of said M modulation encoders to obtain information from each as to how many of said amplifier modules in it's associated group have provided a fault indication and in response thereto provides amplifier module resource availability data for each modulation encoder as to how many amplifier modules in the group associated with that modulation encoder are available for use; said exciter having a priority encoder that provides a said encoder command to each said modulation encoder as to how many amplifier modules in said group associated with that modulation encoder are to be turned on based on said resource availability data and the value of said input signal.

24. A system as set forth in claim 23 wherein the power amplifier modules associated with each said encoder include a first priority group and a second priority group and wherein the power amplifier modules in said first group are to be turned on before any of those in said second group are to be turned on.

25. A system as set forth in claim 24 wherein all of the amplifier modules in said first priority group modules associated with all of said encoders are to be turned on before any of said amplifier modules in said second priority group associated with any of said encoders is turned on.

26. A system as set forth in claim 25 wherein each of said amplifier modules has a status line output for providing a fault indication when that said module has failed and each said encoder has a fault memory for receiving fault indications from its associated power amplifier modules.

27. A system as set forth in claim 26 wherein said exciter has a resource availability memory that stores amplifier availability data as to how many of said amplifier modules associated with each of said encoders is available to be turned on.

28. A system as set forth in claim 27 including a communication link between each said module encoder and said exciter for providing said amplifier availability data to said exciter for storage in said resource availability memory.

* * * * *